(12) United States Patent
Kim et al.

(10) Patent No.: US 9,219,195 B2
(45) Date of Patent: Dec. 22, 2015

(54) COLUMNAR LIGHT EMITTING DEVICE, LIQUID CRYSTAL DISPLAY DEVICE INCLUDING THE SAME, AND METHOD OF MANUFACTURING THE SAME

(71) Applicant: LG Display Co., Ltd., Seoul (KR)

(72) Inventors: Il-Soo Kim, Gyeonggi-do (KR); SeoYoon Lee, Gyeonggi-do (KR); Seong Kyong Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/484,492

(22) Filed: Sep. 12, 2014

(65) Prior Publication Data

US 2015/0070626 A1 Mar. 12, 2015

(30) Foreign Application Priority Data

Sep. 12, 2013 (KR) .......................... 10-2013-0109640

(51) Int. Cl.
| | |
|---|---|
| *H05B 33/02* | (2006.01) |
| *H05B 33/10* | (2006.01) |
| *H05B 33/14* | (2006.01) |
| *H01L 33/18* | (2010.01) |
| *H01L 33/08* | (2010.01) |
| *H01L 33/32* | (2010.01) |
| *H01L 33/42* | (2010.01) |
| *G02F 1/1335* | (2006.01) |
| *H01L 33/00* | (2010.01) |
| *H01L 33/50* | (2010.01) |

(52) U.S. Cl.
CPC ................ *H01L 33/18* (2013.01); *H01L 33/08* (2013.01); *G02F 1/133606* (2013.01); *G02F 2001/133614* (2013.01); *G02F 2202/108* (2013.01); *H01L 33/007* (2013.01); *H01L 33/32* (2013.01); *H01L 33/42* (2013.01); *H01L 33/505* (2013.01); *H01L 2933/0041* (2013.01)

(58) Field of Classification Search
CPC ..... H01L 33/24; H01L 33/32; H01L 33/0075; H01L 2933/0041; H01L 2933/0016; H01L 33/42; H01L 33/50; G02F 1/133617; G02F 1/133603
See application file for complete search history.

(56) References Cited

U.S. PATENT DOCUMENTS

| | | | | |
|---|---|---|---|---|
| 2010/0295079 | A1* | 11/2010 | Melman ........................... | 257/98 |
| 2011/0084298 | A1* | 4/2011 | Lai .................................. | 257/98 |
| 2012/0217503 | A1* | 8/2012 | Jin et al. ......................... | 257/76 |
| 2012/0268687 | A1* | 10/2012 | Kaida .............................. | 349/61 |
| 2013/0240348 | A1* | 9/2013 | Mi et al. ..................... | 204/157.5 |
| 2014/0139780 | A1* | 5/2014 | Wang .............................. | 349/58 |
| 2014/0321162 | A1* | 10/2014 | Toki et al. ..................... | 362/615 |

FOREIGN PATENT DOCUMENTS

WO WO2014/075357 * 5/2014 ............. F21V 19/00

* cited by examiner

*Primary Examiner* — Donald Raleigh
(74) *Attorney, Agent, or Firm* — Morgan, Lewis & Bockius LLP (57) ABSTRACT

A columnar light emitting device is provided. The columnar light emitting device includes an upper transparent electrode layer, a lower transparent electrode layer disposed to be separated from the upper transparent electrode layer, a columnar light emitting structure pattern-formed between the upper transparent electrode layer and the lower transparent electrode layer, a fluorescent part formed between a plurality of the columnar light emitting structures, a P-type electrode pad formed on the upper transparent electrode layer, and an N-type electrode pad formed under the lower transparent electrode layer. The columnar light emitting structure includes a U-GaN layer, an N-type semiconductor layer, an emission layer, and a P-type semiconductor layer.

12 Claims, 11 Drawing Sheets

FIG. 1

Related Art

FIG. 2

Related Art

No Mura

(2)

Center Luminance : 331.2cd/m2
100%

FIG. 7B (1)

No Mura (2)

Center Luminance : 397.7cd/m2
120.1%

COLUMNAR LIGHT EMITTING DEVICE, LIQUID CRYSTAL DISPLAY DEVICE INCLUDING THE SAME, AND METHOD OF MANUFACTURING THE SAME

CROSS-REFERENCE TO RELATED APPLICATIONS

This application claims the benefit of the Korean Patent Application No. 10-2013-0109640 filed on Sep. 12, 2013, which is hereby incorporated by reference as if fully set forth herein.

BACKGROUND OF THE INVENTION

1. Field of the Invention

The present invention relates to a light emitting device and a method of manufacturing the same, and more particularly, to a light emitting device and a method of manufacturing the same, which enhance light efficiency and reduce the manufacturing cost.

2. Discussion of the Related Art

As thin film growth technology is advanced and a light emitting material having good efficiency is developed, the application of a light emitting device including a light emitting diode (LED) is being expanded to a transmission module of an optical communication means, a backlight of a liquid crystal display (LCD) device, a lighting device capable of replacing a fluorescent lamp or an incandescent lamp, and a traffic light.

LEDs use the principle that when a voltage is applied between an anode and a cathode from an external circuit, a positive hole and an electron are injected into the anode and a cathode, the positive hole and the electron are recombined with each other in an active layer which is formed between the anode and the cathode to convert spare energy into light, and the light is emitted to the outside.

Light emitting devices including the LEDs has a structure (a package on board (POB) structure) in which an LED package is coupled to a printed circuit board (PCB), and is supplied with a current from the PCB connected to an external power source to emit light.

Hereinafter, a related art direct type backlight unit using an LED as a backlight and a related art LED package will be described with reference to the drawing.

Figure 1:
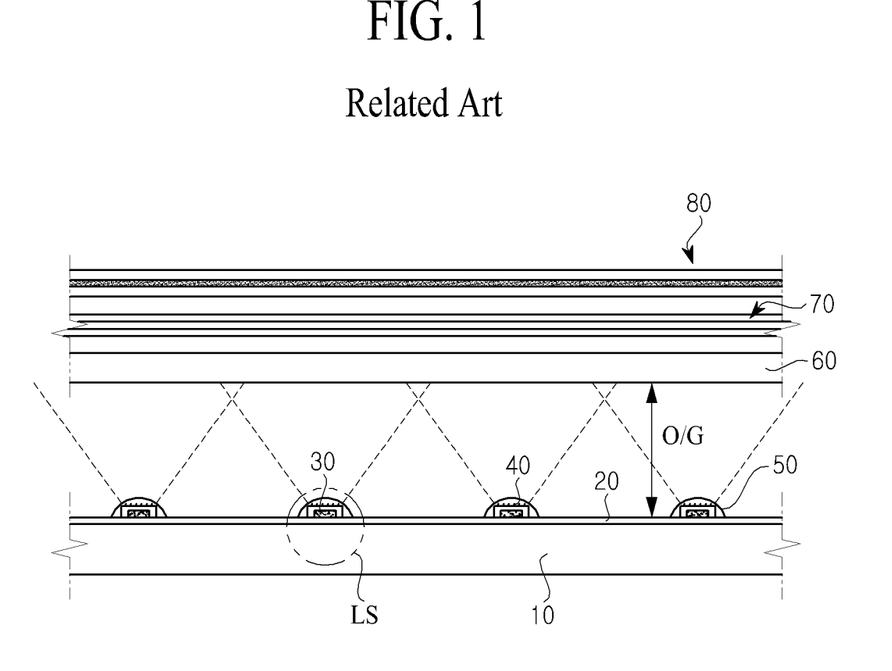
FIG. 1 is a schematic cross-sectional view illustrating a structure of a related art direct type backlight unit for LCD devices.
Figure 2:
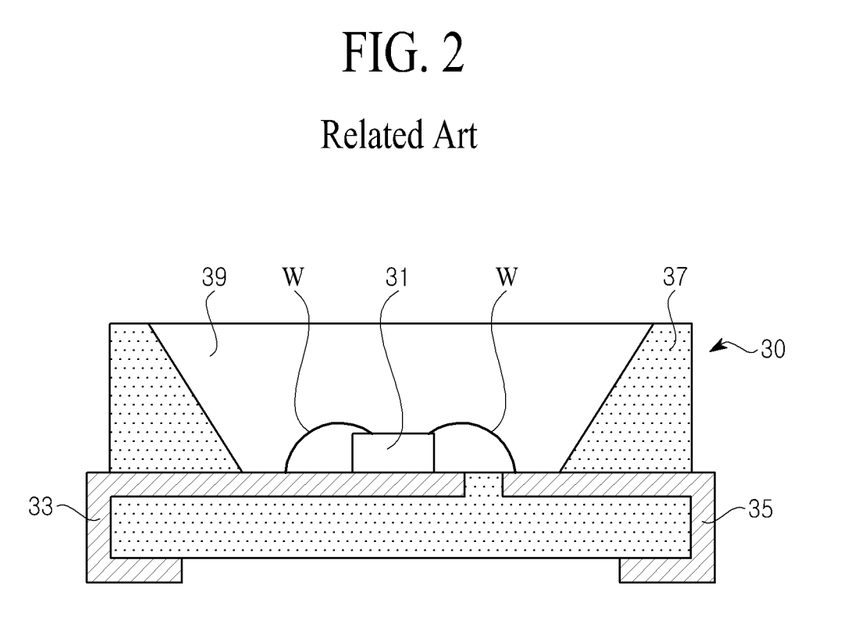
FIG. 2 is a schematic cross-sectional view illustrating a related art LED package included in the related art direct type backlight unit for LCD devices.

FIG. 1 is a schematic cross-sectional view illustrating a structure of a related art direct type backlight unit for LCD devices, and FIG. 2 is a schematic cross-sectional view illustrating a related art LED package included in the related art direct type backlight unit for LCD devices.

With reference to FIG. 1, the related art direct type backlight unit for LCD devices includes an optical sheet 70, a diffusive plate 60, a light source LS, and a reflector 20 which are sequentially arranged under a liquid crystal panel 80. The direct type backlight unit is disposed in a cover bottom 10. Also, the light source LS includes an LED package 30 and a diffractive lens 50. In particular, a plurality of slit patterns 40 are provided at an inner surface or an outer surface of the diffractive lens 50.

Here, although not shown, the liquid crystal panel 80 includes a thin film transistor (TFT) array substrate and a color filter substrate, which are coupled to each other to maintain a uniform cell gap, and a liquid crystal layer which is formed by injecting liquid crystal therebetween.

The diffusive plate 60 diffuses light emitted from the light source LS.

Although not shown, the optical sheet 70 includes a prism sheet, including a lower prism sheet and an upper prism sheet which are used for the purpose of refracting light diffused by the diffusive plate 60 to increase a front luminance of the light, and a protective sheet that protects the prism sheet.

The LED package 30 is provided on the PCB 20 to emit light. The reflector 40 reflects the light, emitted from the LED package 30, to the diffusive plate 60.

The diffractive lens 50 is used to broaden a coverage of the light emitted from the LED package 30.

With reference to FIG. 2, the LED package 30 includes an LED chip 31, a first lead frame 33, a second lead frame 35, a molding part 37, and an encapsulating part 39.

The first lead frame 33 and the second lead frame 35 are electrically connected to a first electrode and a second electrode of a PCB (not shown).

The molding part 37 supports the first and second lead frames 33 and 35.

The encapsulating part 39 is formed of a light-transmitting resin in an open area which is formed on the molding part 37.

The related art direct type backlight unit and the related art LED package have the following problems.

First, the related art direct type backlight unit should use the diffractive lens 50 covering the LED package 30 so as to broaden a light-oriented angle, and whenever a structure of the LED package 30 is changed, the diffractive lens 50 should also be changed.

Second, since the related art direct type backlight unit uses the diffractive lens 50 so as to broaden a coverage of light, an optical gap O/G equal to or greater than a thickness of the diffractive lens 50 occurs, and for this reason, a thickness of an LCD module becomes thicker.

Third, among the LED chip 31, the first lead frame 33, the second lead frame 35, the molding part 37, and the encapsulating part 39 which are included in the related art LED package 30, structures of the first and second lead frames 31 and 33 are changed depending on a characteristic of the LED chip 31, and thus, a shape of the molding part 37 should be changed. For this reason, a reliability of the LEC package 30 is reduced, and the development cost and the manufacturing cost increase.

SUMMARY OF THE INVENTION

Accordingly, the present invention is directed to a light emitting device and a method of manufacturing the same that substantially obviate one or more problems due to limitations and disadvantages of the related art.

An object of the present invention is to provide a columnar light emitting device, an LCD device including the same, and a method of manufacturing the same, that can reduce an optical gap by removing a diffractive lens, and enhance a reliability of an LED package by removing a lead terminal and a molding part.

Additional features and advantages of the invention will be set forth in the description which follows, and in part will be apparent from the description, or may be learned by practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, a columnar light emitting device includes an upper transparent electrode layer; a lower transparent electrode layer disposed to be separated from the upper transparent electrode layer; a columnar light emitting structure pattern-formed between the upper transparent electrode layer and the lower transparent electrode layer; a fluorescent part formed between a plurality of the columnar light emitting structures; a P-type electrode pad formed on the upper transparent electrode layer; and an N-type electrode pad formed under the lower transparent electrode layer, wherein the columnar light emitting structure includes a U-GaN layer, an N-type semiconductor layer, an emission layer, and a P-type semiconductor layer.

In another aspect, a method of manufacturing a columnar light emitting device includes pattern-forming a columnar light emitting structure on a substrate; filling a phosphor between a plurality of the columnar light emitting structures; ashing the phosphor which remains at one side of the columnar light emitting structure; forming an upper transparent electrode layer at the one side of the columnar light emitting structure; removing the substrate; forming a lower transparent electrode layer on the other side of the columnar light emitting structure to be separated from the upper transparent electrode layer by a certain interval; forming a P-type electrode pad on the upper transparent electrode layer; and forming an N-type electrode pad on the lower transparent electrode layer.

In another aspect, an LCD device, which includes a columnar light emitting device, includes a liquid crystal panel configured to display an image; a diffusive plate disposed under the liquid crystal panel; a board disposed under the diffusive plate; and the columnar light emitting device disposed on the board to emit light to the diffusive plate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

Reference will now be made in detail to the exemplary embodiments of the present invention, examples of which are illustrated in the accompanying drawings. Wherever possible, the same reference numbers will be used throughout the drawings to refer to the same or like parts.

In this disclosure below, the term "on" should be construed as including a case where one element is formed at a top of another element and moreover a case where a third element is disposed therebetween.

When one part (or element, device, etc.) is referred to as being 'connected' or 'contacted' to another part (or element, device, etc.), it should be understood that the one part can be 'directly connected' or 'directly contacted' to the other part, but can be 'connected' or 'contacted' to the other part via an intervening part (or element, device, etc.) if there is no specific limitation.

The technical terms are used only for explain a specific exemplary embodiment while not limiting the present invention. The terms of a singular form may include plural forms unless referred to the contrary.

The meaning of "include," "comprise," "including," or "comprising," specifies a property, a region, a fixed number, a step, a process, an element and/or a component but does not exclude other properties, regions, fixed numbers, steps, processes, elements and/or components.

Hereinafter, embodiments of the present invention will be described in detail with reference to the accompanying drawings.

Figure 3:
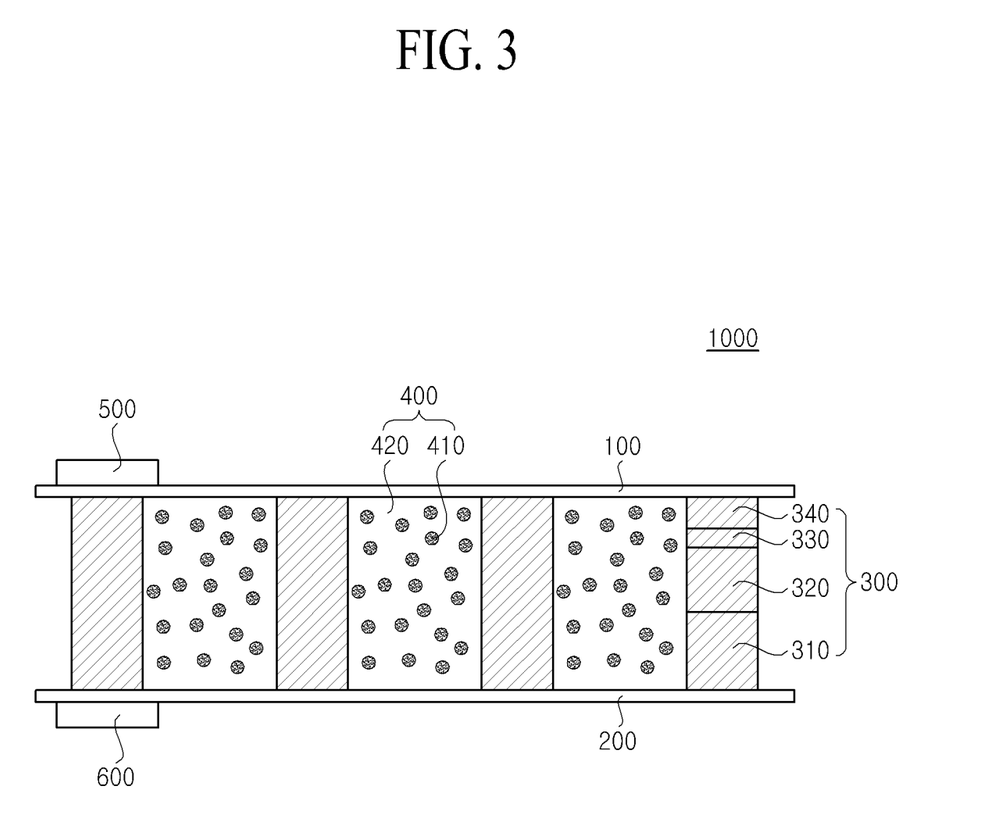
FIG. 3 is a schematic cross-sectional view of a columnar light emitting device according to an embodiment of the present invention.

FIG. 3 is a schematic cross-sectional view of a columnar light emitting device 1000 according to an embodiment of the present invention.

As seen in FIG. 3, the columnar light emitting device 1000 according to an embodiment of the present invention includes an upper transparent electrode layer 100, a lower transparent electrode layer 200, a columnar light emitting structure 300, a fluorescent part 400, a P-type electrode pad 500, and an N-type electrode pad 600.

In the columnar light emitting device 1000 according to an embodiment of the present invention, the columnar light emitting structure 300 is patterned and formed between the upper transparent electrode layer 100 and the lower transparent electrode layer 200 which is disposed to be separated from the upper transparent electrode layer 100 by a certain interval. The fluorescent part 400 is provided between the upper transparent layer 100, the lower transparent electrode layer 200, and the columnar light emitting structure 300. Also, the P-type electrode pad 500 is formed on the upper transparent electrode layer 100, and the N-type electrode pad 600 is formed under the lower electrode layer 200.

The columnar light emitting structure 300 includes a U-GaN layer 310, an N-type semiconductor layer 320, an emission layer 330, and a P-type semiconductor layer 340.

In the columnar light emitting structure 300, the N-type semiconductor layer (N-GaN) 320, the emission layer (multi-quantum well (MQW)) 330, and the P-type semiconductor layer (P-GaN) 340 are sequentially stacked and pattern-formed on the U-GaN layer 310.

In this case, each of the semiconductor layers 320 and 340 may be formed of an inorganic semiconductor such as a SiC-based semiconductor, a ZnO-based semiconductor, a GaAs-based semiconductor, a GaP-based semiconductor, or a GaAsP-based semiconductor, in addition to a GaN-based semiconductor. Furthermore, each of the semiconductor layers 320 and 340 may be formed of at least one appropriately selected from the group consisting of group—semiconductors, group—semiconductors, group—semiconductors, group semiconductors such as Si, and a combination thereof.

The emission layer 330 is a layer that is formed between the N-type semiconductor layer 320 and the P-type semiconductor layer 340 to emit light, and may be formed in a multi-quantum well (MQW) structure that uses an InGaN layer as a well and uses a (Al)GaN layer as a barrier layer. In the emission layer 330, a positive hole having a positive (+) charge generated from the P-type semiconductor layer 340 is combined with a negative (−) charge generated from the N-type semiconductor layer 320 to emit light.

In this case, the light emitted from the emission layer 330 is irradiated in all 360-degree directions (up, down, left, and right directions).

Although not shown, the columnar light emitting structure 300 may be formed in various shapes such as a circular pillar, a hexagonal pillar, and a triangle pillar.

The columnar light emitting structure 300 may be formed to have a diameter of 0.5 μm to 10 μm. Also, the columnar light emitting structure 300 may be pattern-formed to have a certain interval of 0.5 μm to 10 μm. Therefore, in the columnar light emitting device 1000 according to an embodiment of the present invention, a diameter of the columnar light emitting structure is thinly formed, and an interval between a plurality of the columnar light emitting structures is narrowly formed. Accordingly, a density becomes higher, thereby enhancing emission efficiency.

The upper transparent electrode layer 100 is formed on the P-type semiconductor layer 340.

The upper transparent electrode layer 100 may be formed of a transparent metal material such as indium tin oxide (ITO) or Ni/Au, but the present embodiment is not limited thereto. For example, the upper transparent electrode layer 100 may be formed of a transparent conductive material.

The upper transparent electrode layer 100 is electrically connected to the P-type electrode pad 500, and transfers a current, flowing from the P-type electrode pad 500, to the P-type semiconductor layer 340.

The lower transparent electrode layer 200 is formed under the U-GaN layer 310.

The lower transparent electrode layer 200 may be formed of a transparent metal material such as indium tin oxide (ITO) or Ni/Au, but the present embodiment is not limited thereto. For example, the lower transparent electrode layer 200 may be formed of a transparent conductive material.

The lower transparent electrode layer 200 is electrically connected to the N-type electrode pad 600. A current flowing from the P-type electrode pad 500 is transferred to the lower transparent electrode layer 200 via the P-type semiconductor layer 340, the emission layer 330, the N-type semiconductor layer 320, and the U-GaN layer 310.

The P-type electrode pad 500 is formed on the upper transparent electrode layer 100.

The P-type electrode pad 500 is used as a contact pad which electrically connects the upper transparent electrode layer 100 to an external circuit, and transfers a current to the columnar light emitting structure 300 through the upper transparent electrode layer 100.

The N-type electrode pad 600 is formed on the lower transparent electrode layer 200.

The N-type electrode pad 600 is used as a contact pad which electrically connects the lower transparent electrode layer 200 to the external circuit, and a current flowing through the columnar light emitting structure 300 is transferred to the N-type electrode pad 600 through the lower transparent electrode layer 200.

The fluorescent part 400 is sealed by the upper transparent electrode layer 100 and the lower transparent electrode layer 200, and is formed between the plurality of columnar light emitting structures 300.

The fluorescent part 400 may be formed by mixing a phosphor 410 with a resin 420.

In this case, the resin 420 may be a silicon resin, an epoxy resin, or a transparent resin. The phosphor 410 may be a yellow phosphor, a green phosphor, or a red phosphor, but may use a quantum dot phosphor.

The QD phosphor is a nano crystal particle including a core and a shell, and a size of the core is within a range of 1 nm to 50 nm. The QD phosphor may be used as a fluorescent material that emits lights of various colors such as blue (B), yellow (Y), green (G), and red (R) by adjusting the size of the core. The core and shell of the QD phosphor may be formed by hetero-joining at least two kinds of semiconductors selected from group—compound semiconductors (for example, ZnS, ZnSe, ZnTe, CdS, CdSe, CdTe, HgS, HgSe, HgTe, MgTe, etc.), group—compound semiconductors (for example, GaN, GaP, GaAs, GaSb, InN, InP, InAs, InSb, AlAs, AlP, AlSb, AlS, etc.), and group semiconductors (for example, Ge, Si, Pb, etc.). An organic ligand using a material such as oleic acid may be formed at an outer portion of the shell of the QD phosphor, for terminating bonding of molecules at a shell surface, suppressing cohering of QD particles to enhance dispersion in a resin such as a silicon resin or an epoxy resin, or enhancing a function of a phosphor.

Therefore, in the columnar light emitting device 1000 according to an embodiment of the present invention, by using the QD phosphor, wavelengths having different lengths are generated according to a particle size of a nanometer, and thus, various colors can be realized. Also, color reproducibility is good because an emission line width is narrower than that of the existing phosphor.

The columnar light emitting device 1000 according to an embodiment of the present invention has a structure in which the columnar light emitting structure 300 supports the upper transparent electrode layer 100 and the lower transparent electrode layer 200, and the fluorescent part 400 is filled between the upper transparent electrode layer 100, the lower transparent electrode layer 200, and the columnar light emitting structure 300. That is, the columnar light emitting device 1000 needs not include a lead frame, a molding part, and an encapsulating part of a related art light emitting device. Therefore, in comparison with the related art light emitting device, a reliability of the columnar light emitting device 1000 is high, and the development cost and the manufacturing cost can be reduced.

In more detail, since the upper transparent electrode layer 100 and the lower transparent electrode layer 200 are electrically connected to the columnar light emitting structure 300 to transfer a current, the columnar light emitting device 1000 according to an embodiment of the present invention needs not include the lead frame, which transfers a current to an LED chip of the related art light emitting device, and the molding part that supports the lead frame. Also, the encapsulating part of the related art light emitting device may be replaced by the fluorescent part 400.

Therefore, since the columnar light emitting device 1000 according to an embodiment of the present invention does not use the lead frame and the molding part, the development cost and the manufacturing cost can be reduced, and moreover, a reliability of a light emitting device can increase.

Figure 4:
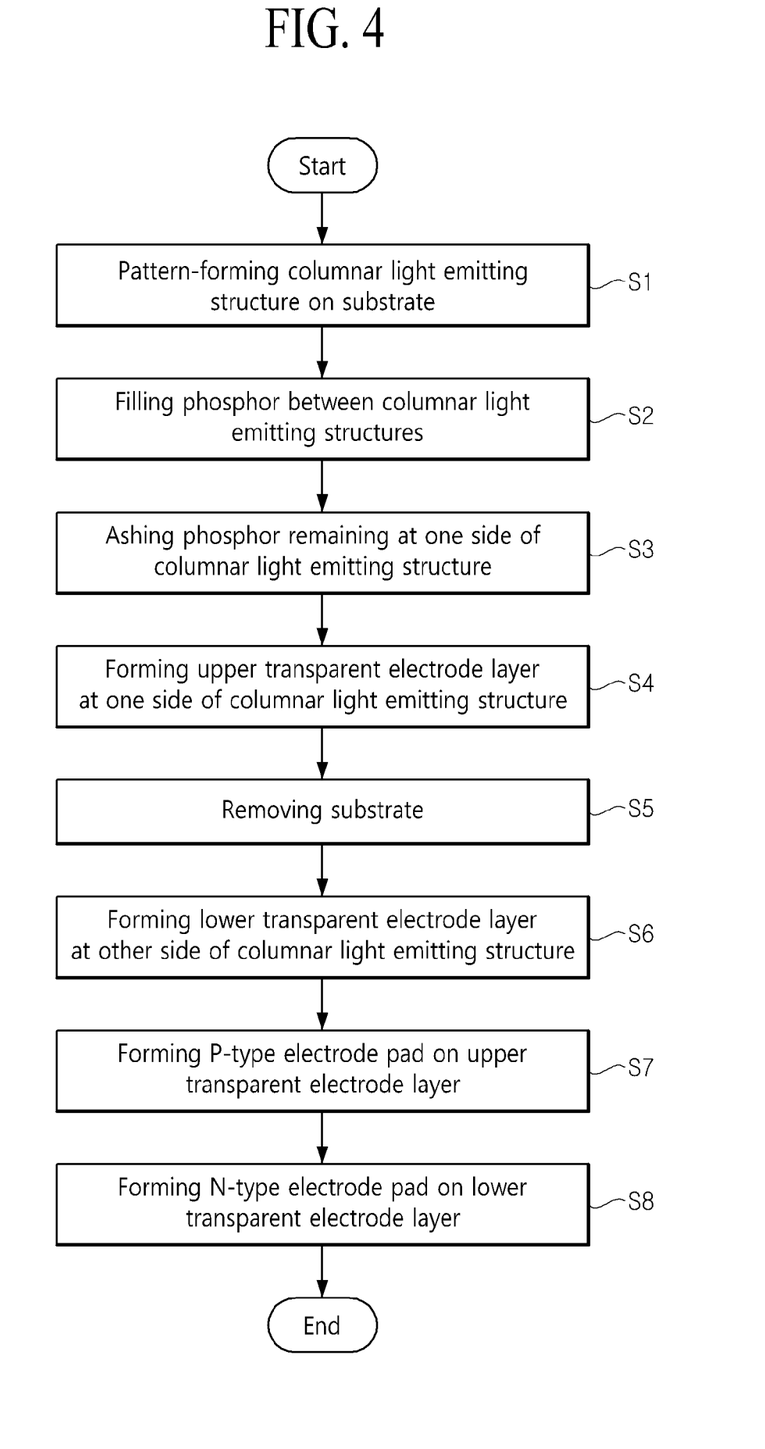
FIG. 4 is a flowchart for describing a process of manufacturing the columnar light emitting device of FIG. 3.

FIG. 4 is a flowchart for describing a process of manufacturing the columnar light emitting device of FIG. 3, and FIGS. 5A to 5H are cross-sectional views illustrating a process of manufacturing the columnar light emitting device of FIG. 3.

Figure 5A:
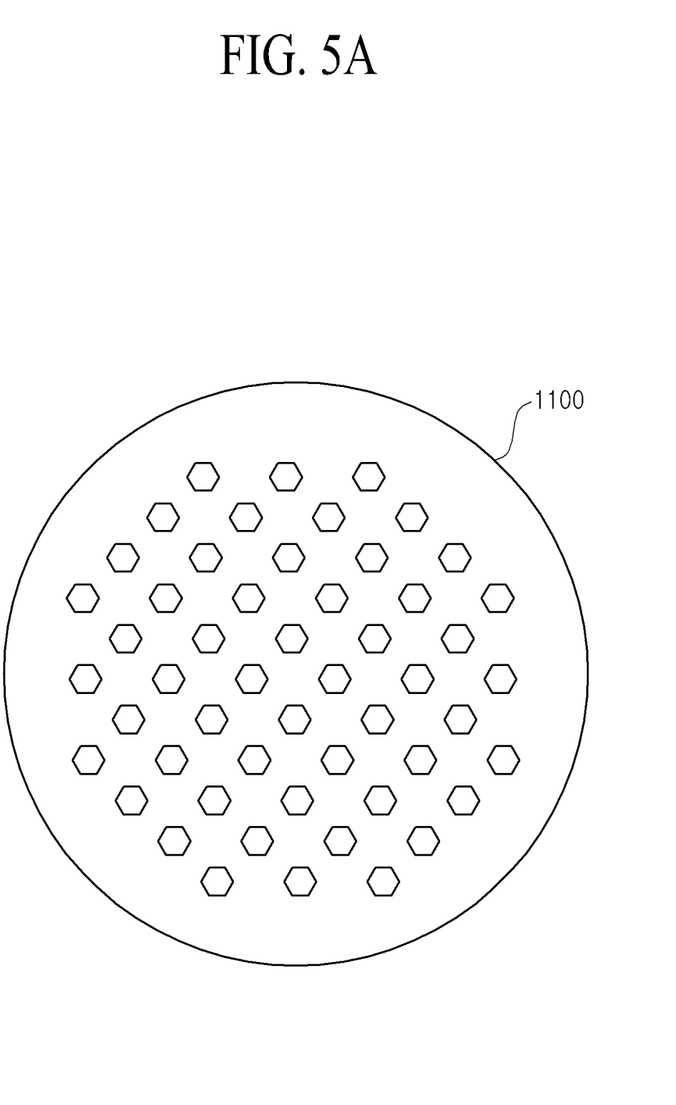
FIGS. 5A to 5H are cross-sectional views illustrating a process of manufacturing the columnar light emitting device of FIG. 3.
Figure 5B:
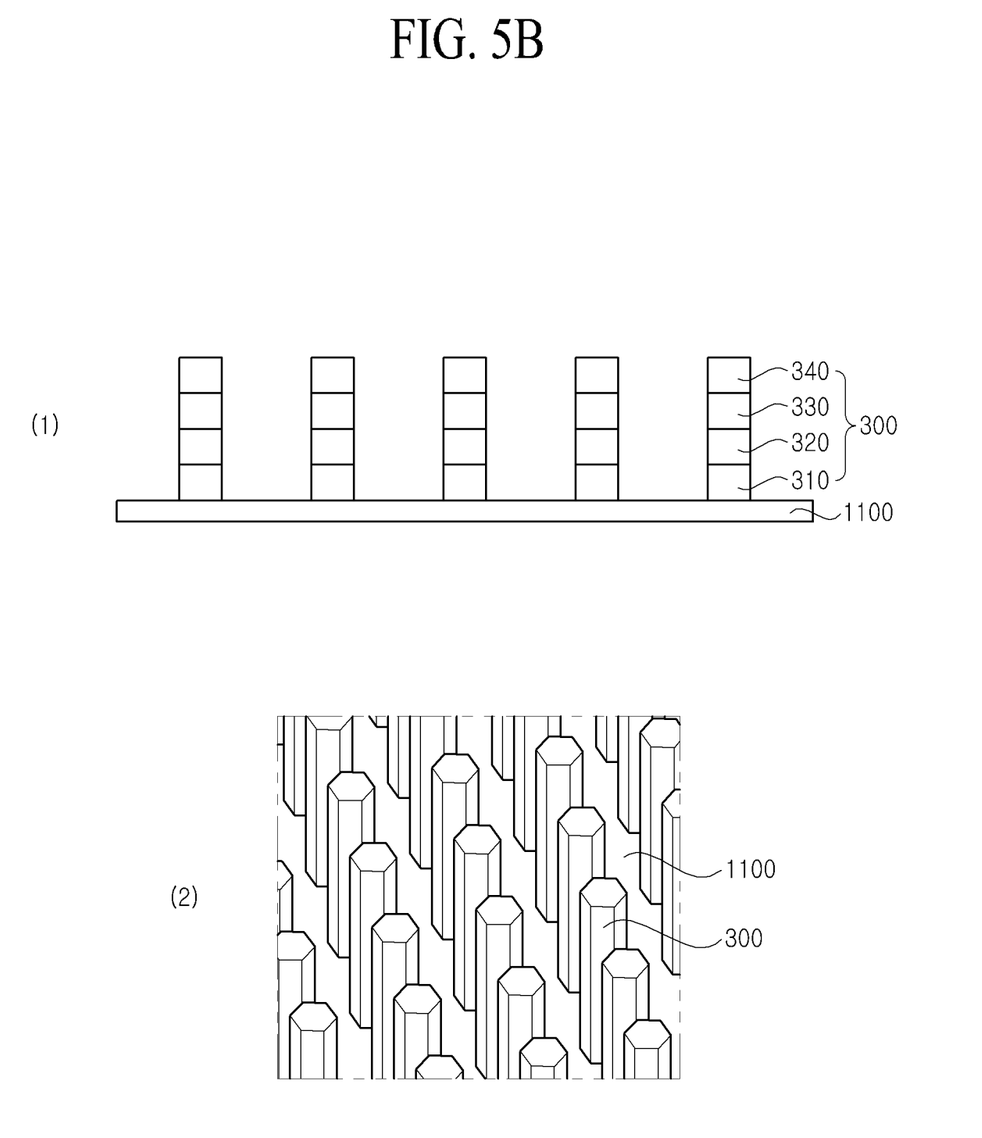

With reference to FIGS. 4, 5A and 5B, in operation S1, the columnar light emitting structure 300 is pattern-formed on a substrate 1100.

In operation S1 of pattern-forming the columnar light emitting structure 300, a surface of the substrate 1100 is patterned at certain intervals. The substrate 1100 may use a sapphire substrate, but may use a low-cost silicon substrate.

Although not shown, photoresist (PR, not shown) is coated on the substrate 1100, and a pattern layer (not shown) is formed by selectively removing the photoresist (not shown) through a development process and an exposure process using a mask (not shown). The substrate 1100 is patterned by an etching process using the pattern layer (not shown) as a blocking layer.

The U-GaN layer 310 which is not doped is formed on the patterned substrate 1100 in a metalorganic chemical vapor deposition (MOCVD) process, and the N-type semiconductor layer 320 is doped on the U-GaN layer 310. This is for preventing a characteristic of a thin film from being degraded by a defect that is caused by a rapid change of a lattice period when the N-type semiconductor layer 320 is formed on the substrate 1100. Subsequently, the columnar light emitting structure 300 is pattern-formed by sequentially doping the active layer 330 and the P-type semiconductor layer 340 on the N-type semiconductor layer 320.

In this case, the columnar light emitting structure 300 may be formed to have a diameter of 0.5 μm to 10 μm. Also, an interval between the columnar light emitting structures 300 may be formed to have a range of 0.5 μm to 10 μm. Therefore, in the columnar light emitting device 1000 according to an embodiment of the present invention, a diameter of the columnar light emitting structure 300 is thinly formed, and an interval between the columnar light emitting structures 300 is narrowly formed. Accordingly, a density becomes higher, thereby enhancing emission efficiency.

Figure 5C:
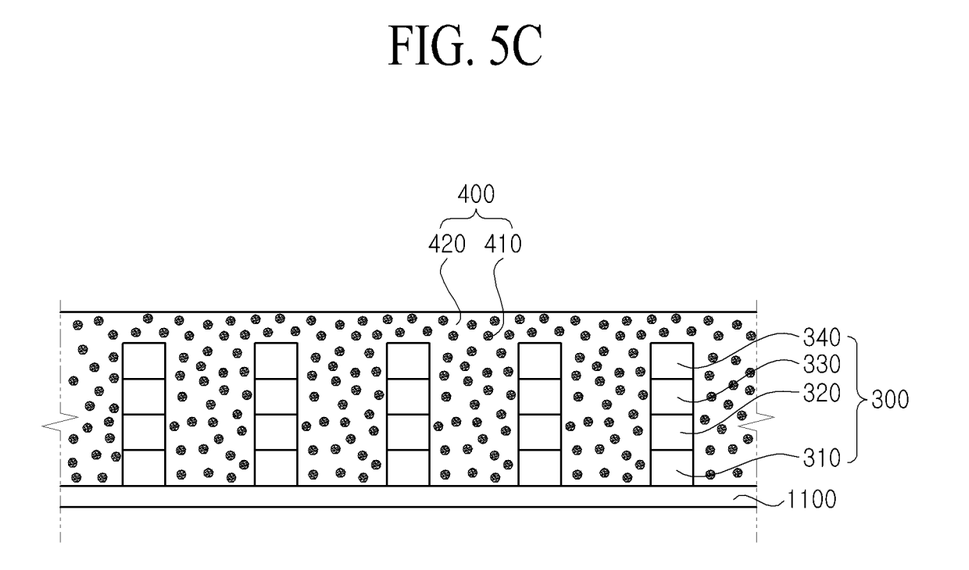

As seen in FIGS. 4 and 5C, in operation S2, a phosphor is filled between the columnar light emitting structures. In detail, the phosphor 410 is mixed with the resin 420 and is filled between the upper transparent electrode layer 100, the lower transparent electrode layer 200, and the columnar light emitting structure 300. In this case, the resin 420 may be a silicon resin, an epoxy resin, or a transparent resin. The phosphor 410 may be a yellow phosphor, a green phosphor, or a red phosphor, but may use a quantum dot phosphor.

Figure 5D:
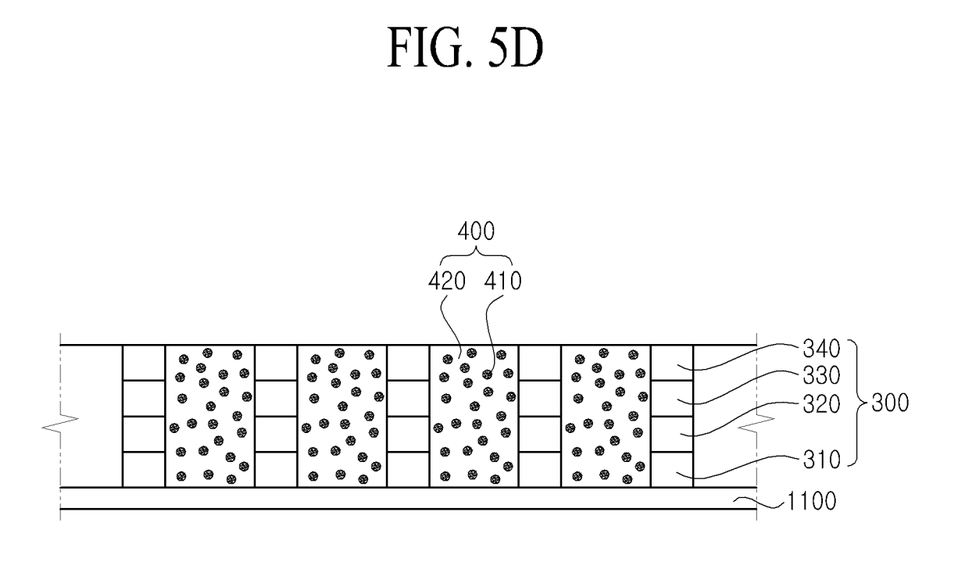

As seen in FIGS. 4 and 5D, in operation S3, the phosphor and the resin which remain in one side of the columnar light emitting structure 300 are removed by an $O_2$ or $N_2$ ashing process.

Figure 5E:
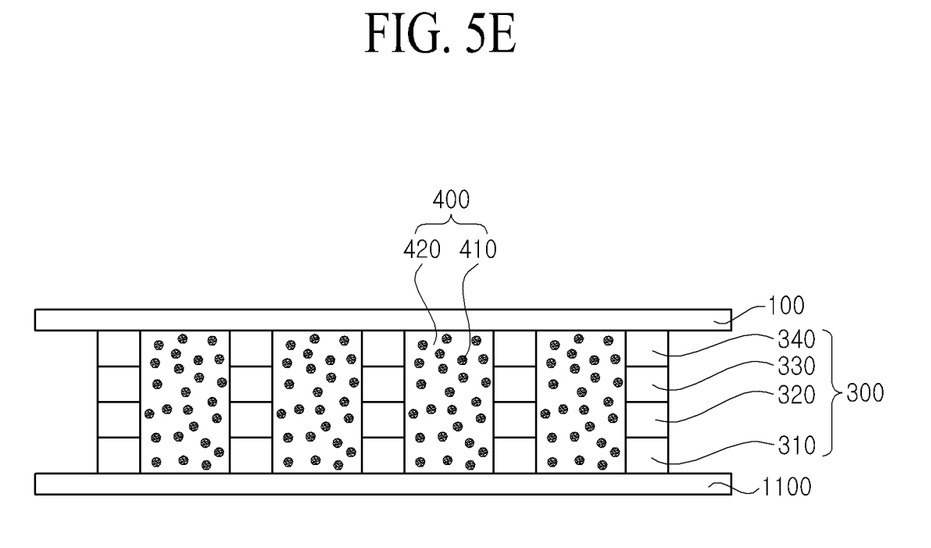

As seen in FIGS. 4 and 5E, in operation S4, the upper transparent electrode layer 110 is formed on one side of the columnar light emitting structure 300. The upper transparent electrode layer 100 may be formed by depositing a p-ITO material in a sputtering process.

Figure 5F:
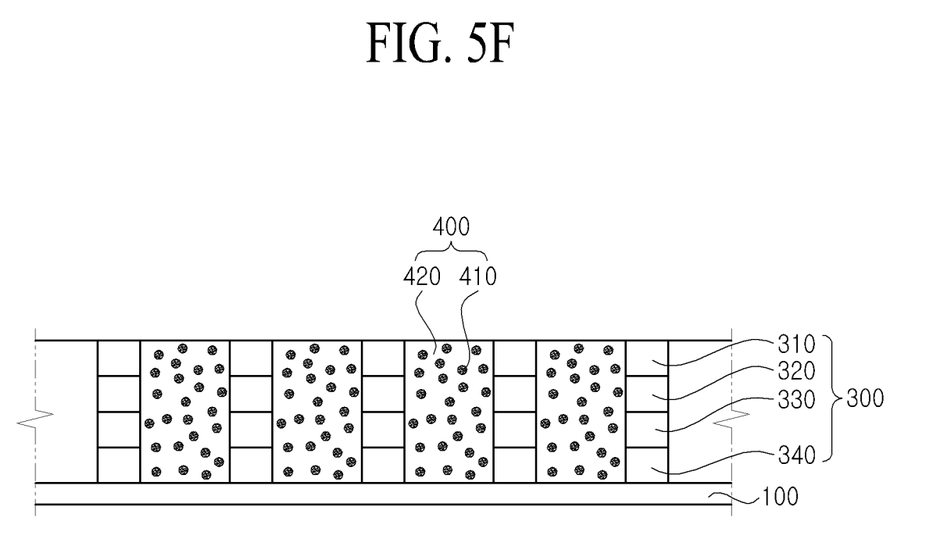

As seen in FIGS. 4 and 5F, in operation S5, the substrate 1100 is removed.

The upper transparent electrode layer 100 is moved to a lower portion by reversing the columnar light emitting structure 300, and the substrate 1100 is removed by a wet etching process.

Figure 5G:
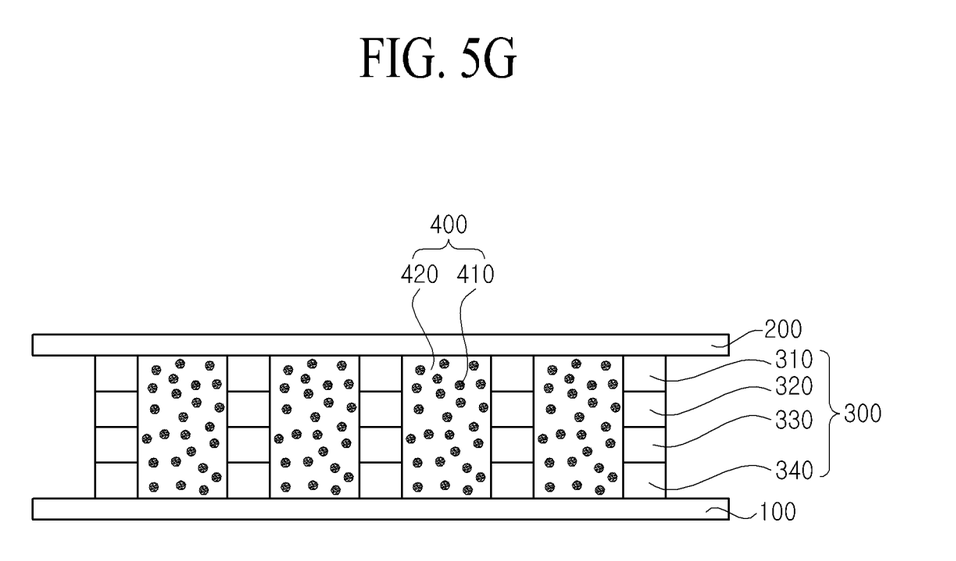

As seen in FIGS. 4 and 5G, in operation S6, the lower transparent electrode layer 200 is formed on the other side of the columnar light emitting structure 300. By depositing an n-ITO material in the sputtering process, the lower transparent electrode layer 200 may be formed on the other side of the columnar light emitting structure 300 to be separated from the upper transparent electrode layer 100 by a certain interval.

Figure 5H:
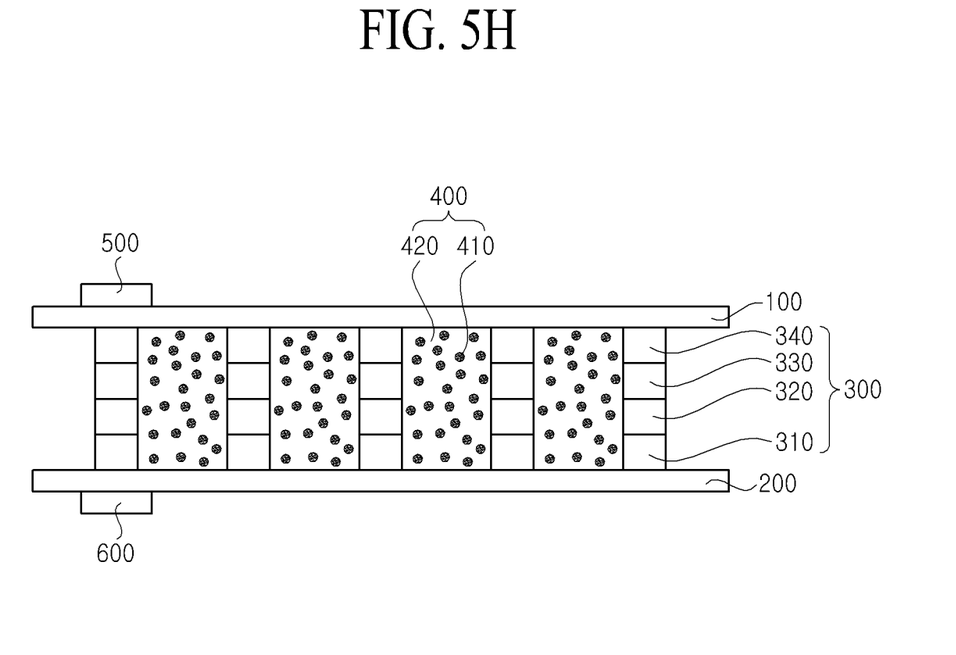

As seen in FIGS. 4 and 5H, the P-type electrode pad 500 is formed on the upper transparent electrode layer 100 in operation S7, and the N-type electrode pad 600 is formed on the lower transparent electrode layer 200 in operation S8. In this case, the P-type electrode pad 500 and the N-type electrode pad 600 may be formed separately from each other, or may be formed at the same time.

Moreover, the P-type electrode pad 500 may be formed at an arbitrary position on the upper transparent electrode layer 100, and the N-type electrode pad 600 may be formed at an arbitrary position on the lower transparent electrode layer 200.

Hereinafter, the same descriptions as those of the material and structure of each of the elements are not repeated.

Figure 6:
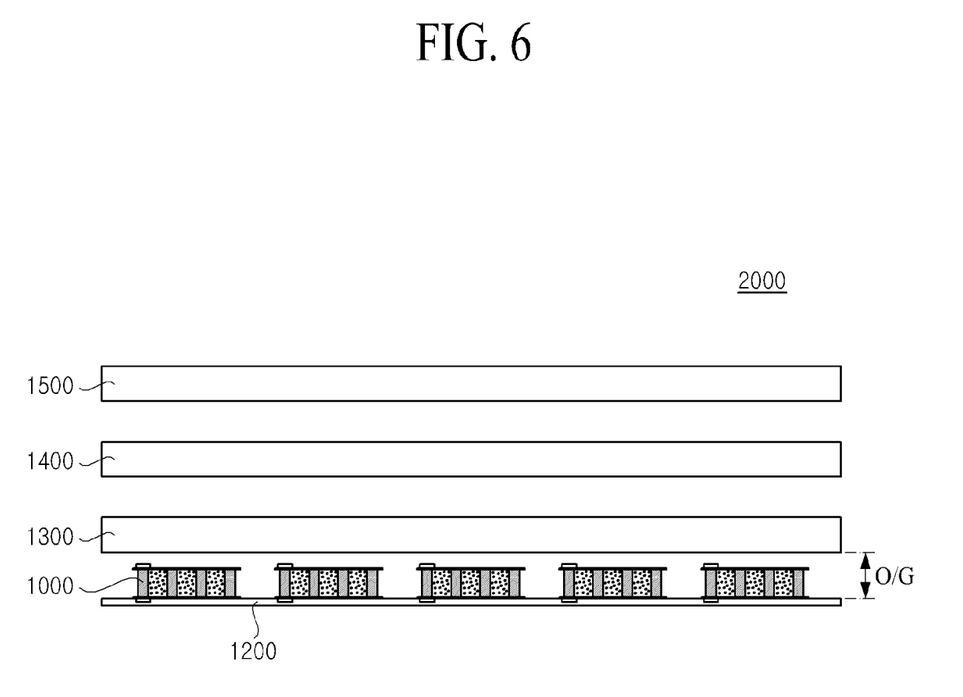
FIG. 6 is a schematic cross-sectional view illustrating an LCD device including a columnar light emitting device according to an embodiment of the present invention.

FIG. 6 is a schematic cross-sectional view illustrating an LCD device 2000 including a columnar light emitting device according to an embodiment of the present invention, and relates to an LCD device including the columnar light emitting device of FIG. 3.

As seen in FIG. 6, the LCD device 2000 including a columnar light emitting device according to an embodiment of the present invention includes the columnar light emitting device 1000 of FIG. 3. Also, the LCD device 2000 may further include a liquid crystal panel 1500 that displays an image, an optical sheet 1400 and a diffusive plate 1300 which are sequentially arranged under the liquid crystal panel 1500, and a board 1200 that is disposed under the diffusive plate 1300.

Although not shown, the liquid crystal panel 1500 includes a TFT array substrate and a color filter substrate, which are coupled to each other to maintain a uniform cell gap, and a liquid crystal layer which is formed by injecting liquid crystal therebetween.

The liquid crystal panel 1500 controls an amount of light emitted from the columnar light emitting device 1000 to display a color image.

The optical sheet 1400 is disposed on the diffusive plate 1300, and enhances a luminance characteristic of light incident from the diffusive plate 1300 to output the light to the outside. Therefore, although not shown, the optical sheet 1400 may include a lower diffusive sheet, a lower prism sheet, an upper prism sheet, and an upper diffusive sheet.

The diffusive plate 1300 is disposed on the columnar light emitting device 1000.

The diffusive plate 1300 diffuses the light emitted from the columnar light emitting device 1000 to convert the light into flat light diffused to an entire area, and irradiates the flat light onto the optical sheet 1400.

The columnar light emitting device 1000 may be disposed on the board 1200, and may emit the light to the diffusive plate 1300. The board 1200 may use a PCB.

The light emitted from the columnar light emitting device 1000 is irradiated in all 360-degree directions (up, down, left, and right directions). The LCD device 2000 including a columnar light emitting device according to an embodiment of the present invention does not use a diffractive lens which is used to broaden a coverage of the light emitted from the columnar light emitting device 1000.

That is, the LCD device 2000 including a columnar light emitting device according to an embodiment of the present invention broadens a coverage of light even without using the diffractive lens, and thus can reduce an optical gap O/G between the columnar light emitting device 1000 and the diffusive plate 1300. For example, the optical gap O/G may be formed to within 1 mm. Accordingly, the LCD device 2000 including a columnar light emitting device according to an embodiment of the present invention can be slimmed in thickness.

Figure 7A:
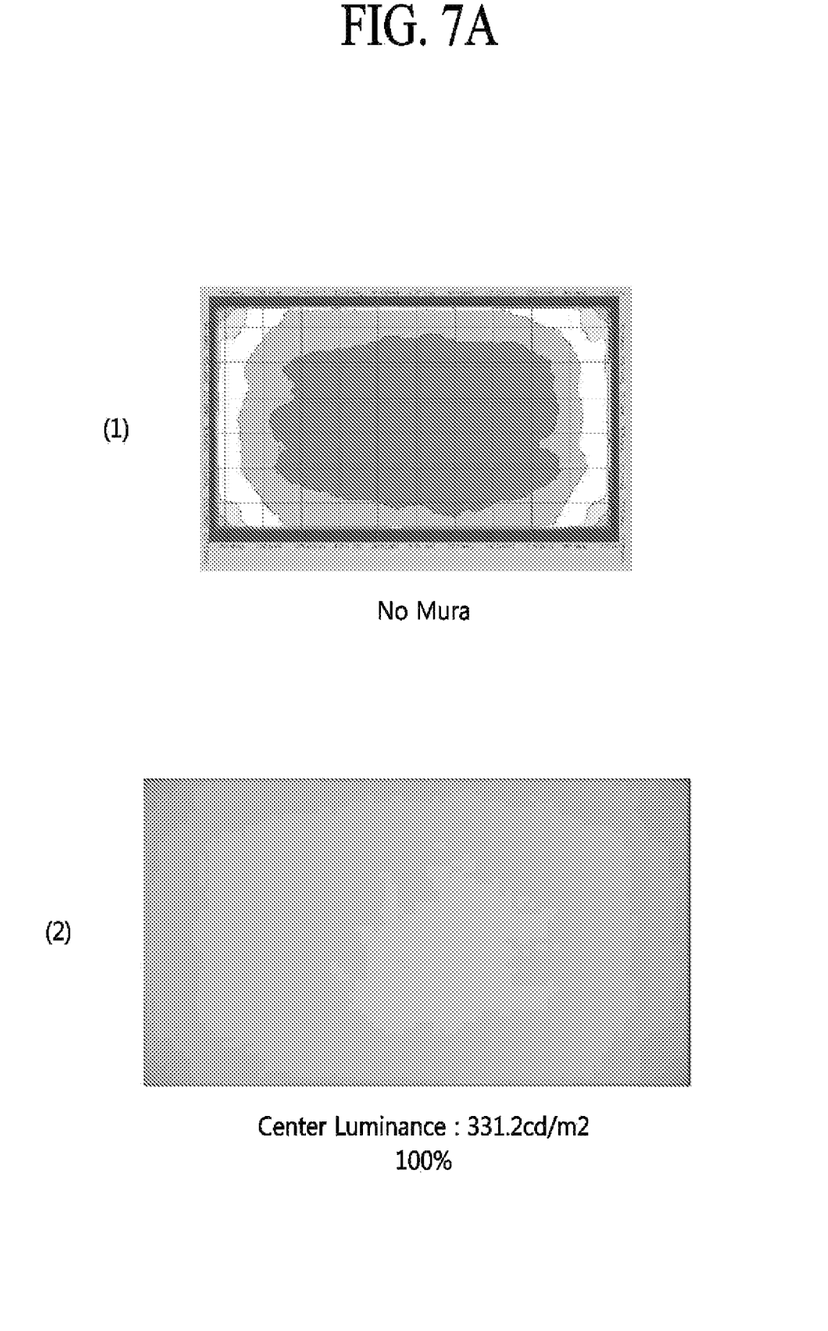
FIGS. 7A and 7B are simulations for describing a luminance characteristic of an LCD device including a columnar light emitting device according to an embodiment of the present invention.
Figure 7B:
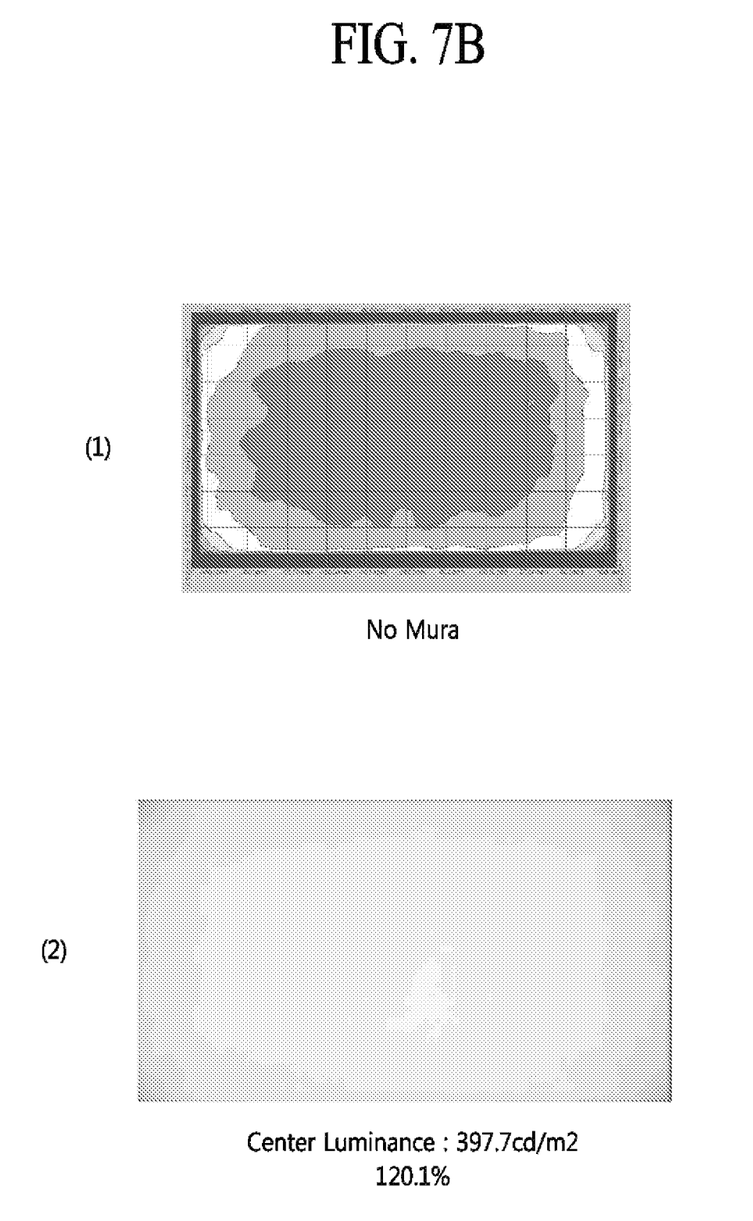

FIGS. 7A and 7B are simulations for describing a luminance characteristic of the LCD device including a columnar light emitting device according to an embodiment of the present invention.

With reference to FIGS. 7A and 7B, FIG. 7A (1) shows a mura defect of a related art LCD device, and FIG. 7A (2) shows a luminance of the related art LCD device. FIG. 7B (1) shows a mura defect of the LCD device including a columnar light emitting device according to an embodiment of the present invention, and FIG. 7B (2) shows a luminance of the LCD device including a columnar light emitting device according to an embodiment of the present invention.

With reference to FIGS. 7A and 7B, the related art LCD device and the LCD device including a columnar light emitting device according to an embodiment of the present invention have no mura, but it can be seen that a luminance of the LCD device including a columnar light emitting device according to an embodiment of the present invention is 20% higher than that of the related art LCD device.

That is, the LCD device including a columnar light emitting device according to an embodiment of the present invention forms the optical gap O/G to within 1 mm, and thus, the optical gap O/G is reduced compared to the related art LCD device. Accordingly, a luminance of the LCD device including a columnar light emitting device according to an embodiment of the present invention is higher than that of the related art LCD device.

Although not shown, a method of manufacturing the LCD device including the columnar light emitting device which uses the method of manufacturing the columnar light emitting device described above with reference to FIGS. 5A to 5H is within the spirit and scope of the present invention.

As described above, the present invention broadens a coverage of light even without using a diffractive lens, and thus can reduce the optical gap between the columnar light emitting device and the diffusive plate, thereby slimming a thickness.

The present invention reduces, to within 1 mm, the optical gap between the columnar light emitting device and the diffusive plate, and thus can increase luminance.

In the present invention, by using a QD phosphor, wavelengths having different lengths are generated according to a particle size of a nanometer, and thus, various colors can be realized. Also, color reproducibility is good because an emission line width is narrower than that of the existing phosphor.

Since the present invention does not use a lead frame and a molding part, the manufacturing cost and the development cost are reduced, and moreover, a reliability of the light emitting device can increase.

Since the present invention thinly forms the diameter of the columnar light emitting structure and narrowly forms an interval between the columnar light emitting structures, a density becomes higher, thereby enhancing emission efficiency.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A columnar light emitting device, comprising:
    an upper transparent electrode layer;
    a lower transparent electrode layer disposed to be separated from the upper transparent electrode layer;
    a columnar light emitting structure pattern-formed between the upper transparent electrode layer and the lower transparent electrode layer;
    a fluorescent part formed between a plurality of the columnar light emitting structures;
    a P-type electrode pad formed on the upper transparent electrode layer; and
    an N-type electrode pad formed under the lower transparent electrode layer,
    wherein the columnar light emitting structure comprises a U-GaN layer, an N-type semiconductor layer, an emission layer, and a P-type semiconductor layer,
    wherein the fluorescent part comprises a quantum dot (QD) phosphor, and the quantum dot (QD) phosphor is uniformly distributed between the upper and lower transparent electrode layers.

2. The columnar light emitting device of claim 1, wherein the columnar light emitting structure has a circular pillar shape, a hexagonal pillar shape, or a triangle pillar shape.

3. The columnar light emitting device of claim 1, wherein the columnar light emitting structure is formed to have a diameter of 0.5 μm to 10 μm.

4. The columnar light emitting device of claim 1, wherein the columnar light emitting structure is pattern-formed to have a certain interval of 0.5 μm to 10 μm.

5. A method of manufacturing a columnar light emitting device, the method comprising:
    pattern-forming a columnar light emitting structure on a substrate;
    filling a phosphor between a plurality of the columnar light emitting structures;
    ashing the phosphor which remains at one side of the columnar light emitting structure;
    forming an upper transparent electrode layer at the one side of the columnar light emitting structure;
    removing the substrate;
    forming a lower transparent electrode layer on the other side of the columnar light emitting structure to be separated from the upper transparent electrode layer by a certain interval;
    forming a P-type electrode pad on the upper transparent electrode layer; and
    forming an N-type electrode pad on the lower transparent electrode layer,
    wherein the phosphor is uniformly distributed between the upper and lower transparent electrode layers.

6. The method of claim 5, wherein the pattern-forming of the columnar light emitting structure comprises:
    patterning a surface of the substrate at certain intervals;
    forming a U-GaN layer on the substrate;
    forming an N-type semiconductor layer on the U-GaN layer;
    forming an active layer on the N-type semiconductor layer; and
    forming a P-type semiconductor layer on the active layer.

7. The method of claim 5, wherein the substrate is a silicon substrate.

8. The method of claim 5, wherein the columnar light emitting structure is formed to have a diameter of 0.5 μm to 10 μm.

9. The method of claim 5, wherein the columnar light emitting structure is pattern-formed to have a certain interval of 0.5 μm to 10 μm.

10. A liquid crystal display (LCD) device including a columnar light emitting device, the LCD device comprising:
    a liquid crystal panel configured to display an image;
    a diffusive plate disposed under the liquid crystal panel;
    a board disposed under the diffusive plate; and
    the columnar light emitting device of claim 1, wherein the columnar light emitting device is disposed on the board to emit light to the diffusive plate.

11. The LCD device of claim 10, wherein an optical gap between the diffusive plate and the board is 1 mm or less.

12. A method of manufacturing a liquid crystal display (LCD) device including a columnar light emitting device, the method comprising a method of manufacturing a columnar light emitting device,
- wherein the method of manufacturing the columnar light emitting device comprises:
  - pattern-forming a columnar light emitting structure on a substrate;
  - filling a phosphor between a plurality of the columnar light emitting structures;
  - ashing the phosphor which remains at one side of the columnar light emitting structure;
  - forming an upper transparent electrode layer at the one side of the columnar light emitting structure;
  - removing the substrate;
  - forming a lower transparent electrode layer on the other side of the columnar light emitting structure to be separated from the upper transparent electrode layer by a certain interval;
  - forming a P-type electrode pad on the upper transparent electrode layer; and forming an N-type electrode pad on the lower transparent electrode layer,
- wherein the phosphor is uniformly distributed between the upper and lower transparent electrode layers.

* * * * *